(12) United States Patent
Strip

(10) Patent No.: US 6,870,196 B2
(45) Date of Patent: Mar. 22, 2005

(54) SERIES/PARALLEL OLED LIGHT SOURCE

(75) Inventor: David R. Strip, Albuquerque, NM (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/392,268

(22) Filed: Mar. 19, 2003

(65) Prior Publication Data

US 2004/0183067 A1 Sep. 23, 2004

(51) Int. Cl.[7] .................. H01L 27/15; H01L 31/12; H01L 33/00
(52) U.S. Cl. ..................... 257/79; 313/498
(58) Field of Search ............ 257/79, 88, 89, 257/90, 91, 92, 93, 94, 95, 96, 97, 98, 80, 81, 82, 83, 84, 85, 86, 87; 313/483, 498

(56) References Cited

U.S. PATENT DOCUMENTS

| | | | |
|---|---|---|---|
| 5,247,190 A | 9/1993 | Friend et al. | |
| 6,337,492 B1 | 1/2002 | Jones et al. | |
| 2002/0063533 A1 | 5/2002 | Swallow | |
| 2002/0190661 A1 | 12/2002 | Duggal et al. | |
| 2003/0010985 A1 | 1/2003 | Shen | |
| 2003/0116773 A1 | * 6/2003 | Kraus et al. | |
| 2004/0004589 A1 | * 1/2004 | Shih | |

* cited by examiner

Primary Examiner—Long Pham
Assistant Examiner—Dana Farahani
(74) Attorney, Agent, or Firm—Andrew J. Anderson; Thomas H. Close

(57) ABSTRACT

An organic light emitting diode (OLED) light source comprises a plurality of groups of OLEDs, the OLEDs in each group being electrically connected in parallel, and the groups being electrically connected in series.

14 Claims, 5 Drawing Sheets

SERIES/PARALLEL OLED LIGHT SOURCE

FIELD OF THE INVENTION

The present invention relates to organic light emitting diode (OLED) light sources, and more particularly to structures for electrically connecting a plurality of light emitting elements in an OLED light source.

BACKGROUND OF THE INVENTION

U.S. patent application Ser. No. 2002/0190661, by Duggal et al., published Dec. 19, 2002, discloses an organic light emitting diode (OLED) light source that comprises a plurality of OLEDs that are arranged in a plurality of groups. The OLEDs in a group are electrically connected in series, and the groups are electrically connected in parallel. This arrangement is referred to herein as a Parallel/Series arrangement. This Parallel/Series arrangement allows for the use of AC power sources at voltage potentials much higher than the drop across an individual OLED and is tolerant to a short failure across one or more of the OLEDs in one or more of the groups. The Parallel/Series arrangement suffers however from the problem that an open failure in any one of the OLEDs in a group renders all of the OLEDs in that entire group inoperative. The Parallel/Series arrangement as shown requires tight tolerances in each masking step and is therefore difficult to fabricate.

There is a need therefore for an improved arrangement of OLEDs in a light source that avoids the problems noted above.

SUMMARY OF THE INVENTION

The need is met according to the present invention by providing an organic light emitting diode (OLED) light source that comprises a plurality of groups of OLEDs, the OLEDs in each group being electrically connected in parallel, and the groups being electrically connected in series, herein called a Series/Parallel arrangement.

ADVANTAGES

The Series/Parallel OLED light source of the present invention has the advantage of being tolerant to both short and open failures in an OLED in light source.

DETAILED DESCRIPTION OF THE INVENTION

Figure 1:
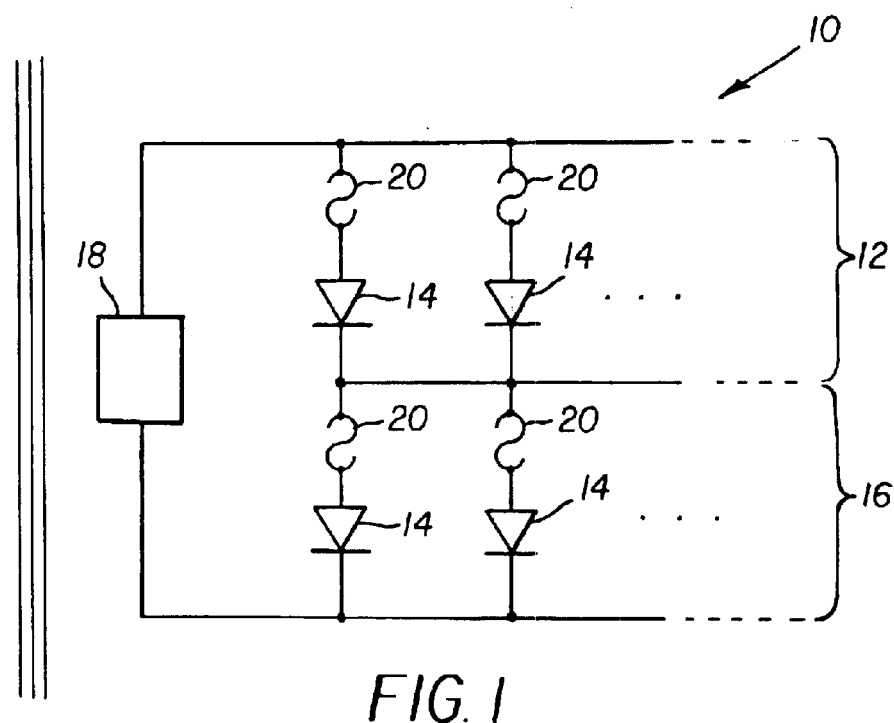
FIG. 1 is an electrical schematic diagram of a Series/Parallel OLED light source according to one embodiment of the invention.

Referring to FIG. 1, a Series/Parallel OLED light source 10 according to one embodiment of the invention includes a first group 12 of OLEDs 14 and a second group 16 of OLEDs 14. The OLEDs 14 in the first and second groups 12 and 16 respectively are electrically connected in parallel, and the groups 12 and 16 are connected in series. A power source 18, such as a DC power supply or battery, is connected to the light source 10 to power the light source. It will be understood that two groups having two diodes each is shown for illustrative purposes, but more than two groups of more that two diodes each can be arranged in a Series/Parallel arrangement according to the present invention. This Series/Parallel arrangement is superior to the prior art Parallel/Series arrangement since it is tolerant of both open and short failures when fuses are included as described below.

If an OLED in a group fails open, current still flows through the other OLEDs in the group, thereby illuminating the remaining OLEDs in the group and providing current to the other groups in the series. If OLEDs fail short, some of the current flows through the short, but some current is still available to the other OLEDs in the group.

A short failure in one of the OLEDs of a group may reduce the current to the other OLEDs in the group, thereby causing the other OLEDs in the group to become dimmer. To address this situation, a fuse 20 may be provided between the cathode of each OLED and the electrical conductor that connects the cathodes of the group of OLEDs in parallel. If a short occurs in one of the OLEDs, the increased current through the shorted OLED opens the fuse, thereby converting the short failure to an open failure.

Figure 2:
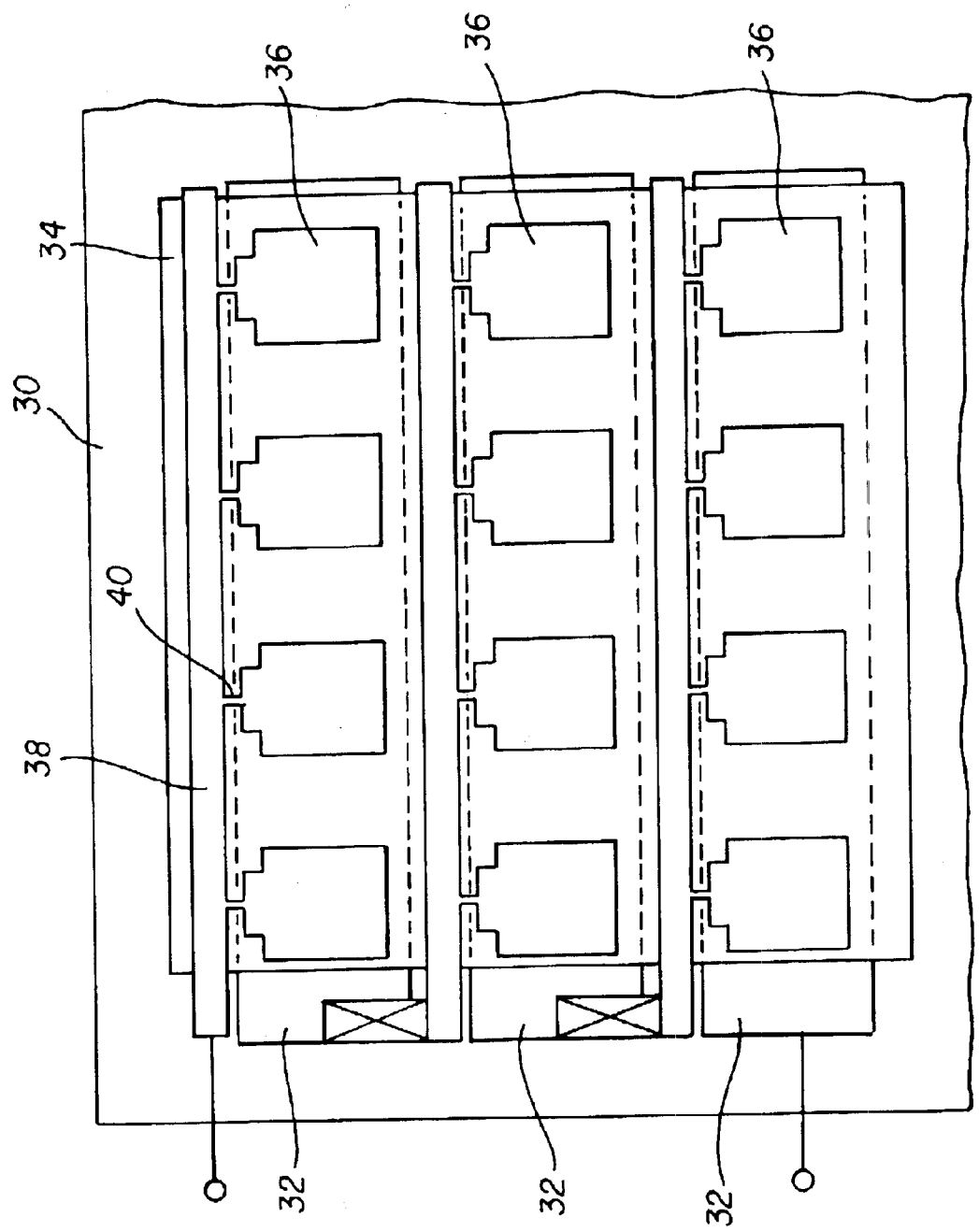
FIG. 2 is a layout diagram of the Series/Parallel OLED light source shown in FIG. 1.

Referring to FIG. 2, a layout diagram of the Series/Parallel OLED light source of the type shown in FIG. 1 having three groups of four OLEDs each is shown. The layout includes a patterned first conductive layer formed on a substrate 30 to define a common anode 32 for each group of OLEDs. An unpatterned layer 34 of OLED material is deposited over the anodes 32. A second patterned conductive layer is deposited over the layer of OLED material 34 to define cathodes 36 for each group of OLEDs. The cathodes 36 of each group are electrically connected in parallel by a strip of conductor 38, and the individual cathodes 36 are connected to the conductor strip 38 by narrow necks 40 of the conductive layer. The narrow necks 40 function as the fuses 20 shown in FIG. 1. The cathode conductor strips 38 in each successive group are electrically connected to the anodes 32 of the previous group in the series of groups in a region of overlap, as shown by the Xs in FIG. 2.

For most common lighting applications, the available power source is AC. The arrangement shown in FIGS. 1 and 2 only takes advantage of one half of an AC cycle unless the AC power source is full-wave rectified.

Figure 3:
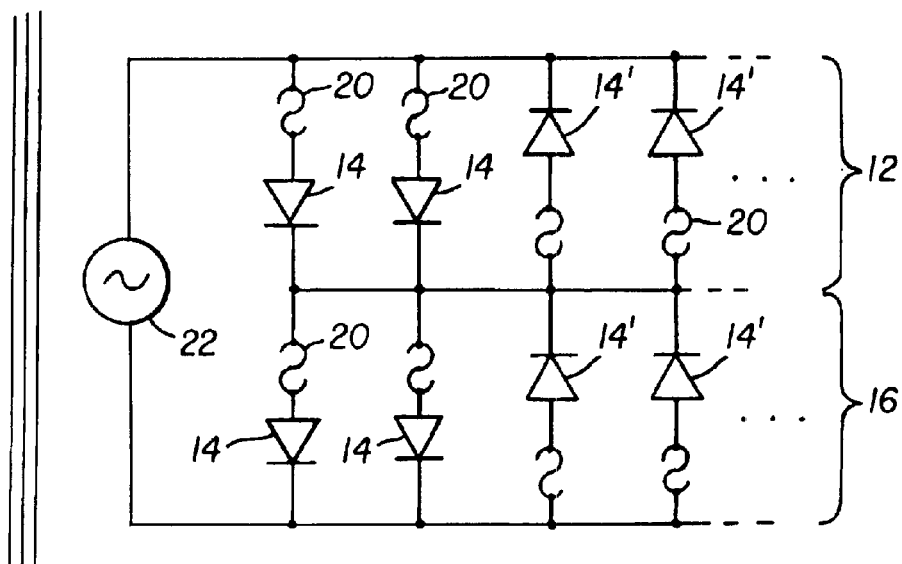
FIG. 3 is an electrical schematic diagram of a Series/Parallel OLED light source according to an alternative embodiment of the invention.
Figure 7:
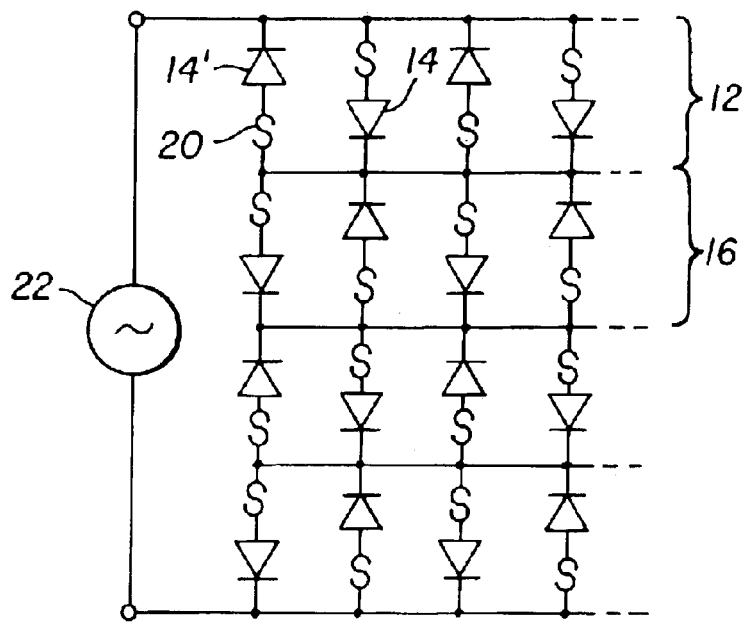
FIG. 7 is an electrical schematic diagram of a Series/Parallel OLED light source according to a still further alternative embodiment of the invention.

Referring to FIG. 3, in an alternative arrangement according to the present invention, each group 12 and 16 includes a number of diodes 14 that are connected in one direction, and a number of diodes 14' that are connected in the opposite direction. With this arrangement, the diodes connected in the one direction will emit light during one half cycle of an AC power source 22, and the diodes connected in the other direction will emit light during the other half cycle. If the number of diodes in the light source that are arranged in each direction are equal, the light source will emit the same amount of light during each half cycle. In one example of this arrangement, the diodes in each group alternate directions as shown in FIG. 7.

Figure 4:
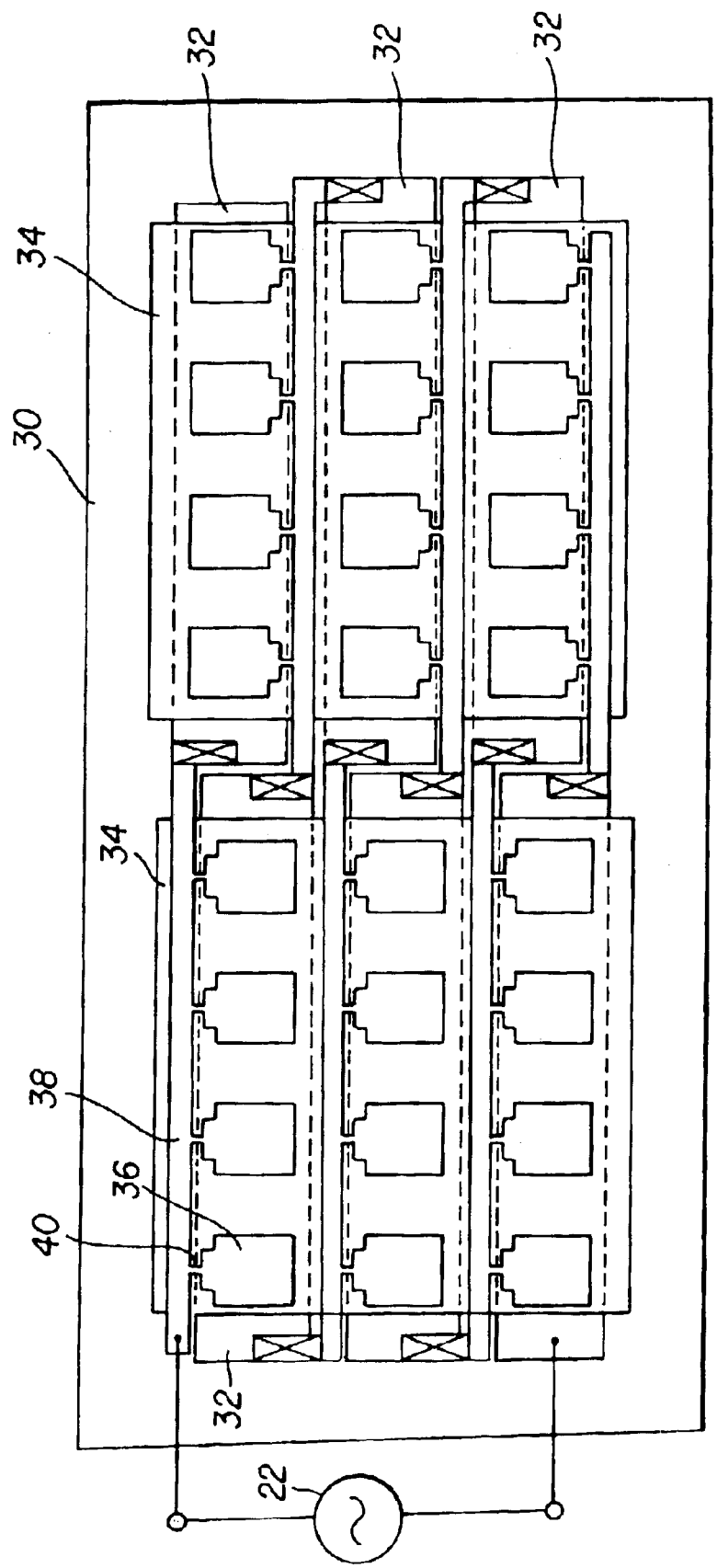
FIG. 4 is a layout diagram of the Series/Parallel OLED light source shown in FIG. 3.

Referring to FIG. 4, a layout diagram of the Series/Parallel OLED light source of the type shown in FIG. 3 having three groups of eight OLEDs each is shown. The layout includes a patterned first conductive layer formed on a substrate 30 to define common anodes 32 for each group of OLEDs. Unpatterned layers 34 of OLED material are deposited over the anodes 32. A second patterned conductive layer is deposited over the layer of OLED material 34 to define cathodes 36 for each group of OLEDs. The cathodes 36 of each group are electrically connected in parallel by a strip of conductor 38, and the individual cathodes 36 are connected to the conductor strip 38 by narrow necks 40 of the conductive layer. The narrow necks 40 function as the fuses 20 shown in FIG. 3. Each group includes four OLEDs that are connected in one direction and four OLEDs that are connected in the opposite direction; the cathode conductor strip of the first four OLEDs in a group is electrically connected to the anode of the second four OLEDs in a group, and vice versa, in the regions of overlap shown by Xs in the center of the device. The cathode conductor strips 38 in each successive group are electrically connected to the anodes 32 of the previous group in the series of groups in a region of overlap, as shown by the Xs at both ends of the device as shown in FIG. 4.

Figure 5:
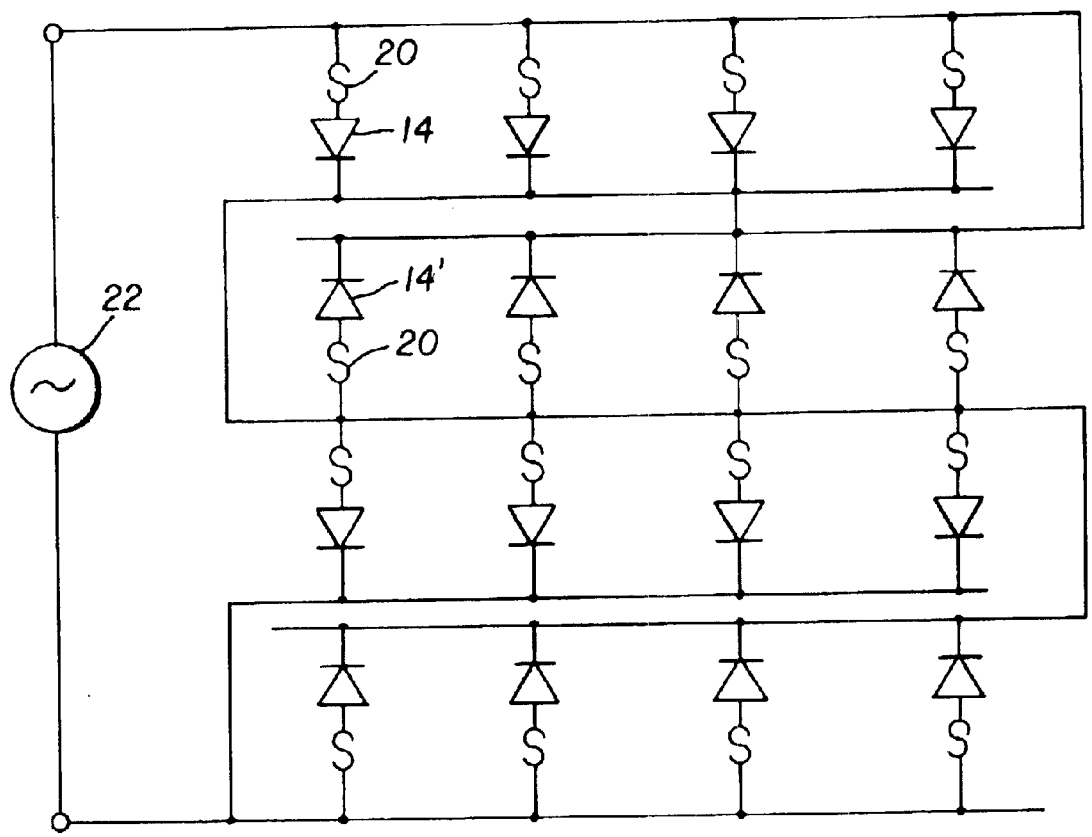
FIG. 5 is an electrical schematic diagram of a Series/Parallel OLED light source according to a further alternative embodiment of the invention.

Alternatively, the layout of the light source can be arranged such that lines of diodes connected in one direction are interleaved with lines of diodes connected in an opposite direction, as shown schematically in FIG. 5, so that alternating lines of diodes would be illuminated on the alternating phases of the AC power source.

Figure 6:
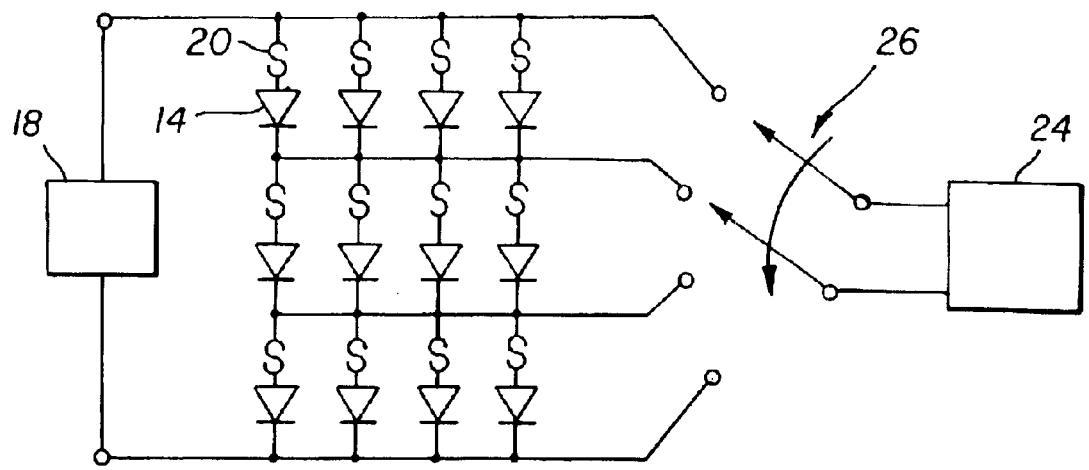
FIG. 6 is an electrical schematic diagram of the Series/Parallel OLED light source of the type shown in FIG. 1 including means for sequentially applying a reverse bias current to the groups of diodes.

Physical constants may make it difficult to size the narrow necks 40 of conductive material that comprise the fuses 20 so that they will reliably open when a short occurs in a diode. To insure that the fuses blow in response to a short in the diode, a reverse bias current may be periodically applied to sets of diodes that are connected in parallel in the same direction. FIG. 6 schematically illustrates this technique for a light source in which the groups of diodes are all connected in the same direction, such as that shown in FIG. 1. Since the diodes in one group would block a reverse bias current to the diodes in the other groups, the polarity of the power applied to the light source can't simply be reversed to apply the reverse bias. Instead, each group of diodes is sequentially connected to a source 24 of reverse polarity voltage, shown schematically as a rotary switch 26 in FIG. 6. The electronics for sequentially applying the reverse bias voltage may be provided in the light source itself, or in a luminaire that receives the light source.

In an arrangement where the diodes in a group include subgroups that are connected in opposite directions, such as that shown in FIG. 5, the reverse bias current would be applied independently to each subgroup of diodes in each group.

Since the conductivity of the conductor strip 38 that provides electrical connection to the cathodes can influence the uniformity of the light source, a high conductivity bus, such as silver or copper, in electrical contact with the conductor strip 38 can be provided to decrease the resistance of the conductor strip 38. This technique can be employed with any of the arrangements described above to increase the conductivity of the electrical connections to the cathodes.

The present invention can be employed in a wide variety of conventional applications, for example in a table-top lamp, floor-lamp, or chandelier. Alternatively, the invention can be employed as a flat-panel illumination device for a conventional suspended ceiling. The present invention can also be employed in portable illumination devices using DC power sources.

In a preferred embodiment, the invention is employed in a device that includes Organic Light Emitting Diodes (OLEDs) which are composed of small molecule or polymeric OLED materials as disclosed in but not limited to commonly-assigned U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting materials can be used to fabricate such a device.

Substrate

The OLED apparatus of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Any one or more of the substrate, anode, or cathode may be transparent.

Anode

When EL emission is through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes or by using shadow masks during preparation.

Hole-Injecting Layer (HIL)

It is often useful to provide a hole-injecting layer between the anode and the emissive layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly assigned U.S. Pat. No. 4,720,432, and plasma-deposited fluorocarbon polymers as described in commonly assigned U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in commonly-assigned U.S. Pat. Nos. 4,769,292 and 5,935,721, the light-emitting layer (LEL) of the organic EL element includes a luminescent or fluorescent material where electroluminescence is produced as a result of electron-hole pair recombination in this region. The light-emitting layer can include a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

Aluminum trisoxine[alias, tris(8-quinolinolato)aluminum (III)]
CO-2: Magnesium bisoxine[alias, bis(8-quinolinolato) magnesium(II)]
CO-3: Bis[benzo{f}-8-quinolinolato]zinc(II)
CO-4: Bis(2-methyl-8-quinolinolato)aluminum(III)-µ-oxo-bis(2-methyl-8-quinolinolato) aluminum(III)
CO-5: Indium trisoxine[alias, tris(8-quinolinolato) indium]
CO-6: Aluminum tris(5-methyloxine)[alias, tris(5-methyl-8-quinolinolato) aluminum(III)]
CO-7: Lithium oxine[alias, (8-quinolinolato)lithium(I)]
CO-8: Gallium oxine[alias, tris(8-quinolinolato)gallium (III)]
CO-9: Zirconium oxine[alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in commonly assigned U.S. Pat. No. 4,356,429 and various heterocyclic optical brighteners as described in commonly assigned U.S. Pat. No. 4,539,507. Benzazoles and triazines are also useful electron-transporting materials.

In some instances, the light-emitting layer and electron-transport layers can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is solely through the anode, the cathode used in this invention can include nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly assigned U.S. Pat. No. 4,885,221. Another suitable class of cathode materials includes bilayers including a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in commonly assigned U.S. Pat. No. 5,677,572. Other useful cathode material sets include, but are not limited to, those disclosed in commonly assigned U.S. Pat. Nos. 5,059,861; 5,059,862, and 6,140,763.

When light emission is through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236. EP 1 076 368, and JP 3,234,963. Cathode materials are typically deposited by evaporation, sputtering, or chemical vapor deposition. When needed, patterning can be achieved through many well known methods including, but not limited to, through-mask deposition, integral shadow masking as described in commonly assigned U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in commonly-assigned U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (commonly-assigned U.S. Pat. No. 5,294,870), spatially-defined thermal dye transfer from a donor sheet (commonly-assigned U.S. Pat Nos. 5,851,709 and 6,066,357) and inkjet method (commonly-assigned U.S. Pat. No. 6,066,357).

Encapsulation

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

The invention has been described in detail with particular reference to certain preferred embodiments thereof, but it will be understood that variations and modifications can be effected within the spirit and scope of the invention.

PARTS LIST

10 Series/Parallel light source
12 group of parallel connected OLEDs
14 OLED
14' OLED
16 group of parallel connected OLEDs
18 power source
20 fuse
22 AC power source
24 source of reverse polarity voltage
26 rotary switch
30 substrate
32 anode
34 layer of OLED material
36 cathode
38 conductor strip
40 narrow neck of conductor

What is claimed is:

1. An organic light emitting diode (OLED) light source, comprising a plurality of groups of OLEDs, the OLEDs in each group being electrically connected in parallel, and the groups being electrically connected in series.

2. The light source claimed in claim 1, further comprising a fuse connected in series with each OLED for opening the electrical connection to an OLED in response to a short.

3. An organic light emitting diode (OLED) light source, comprising a plurality of groups of OLEDs, the OLEDs in each group being electrically connected in parallel, and the groups being electrically connected in series, further comprising a fuse connected in series with each OLED for opening the electrical connection to an OLED in response to a short, wherein each of the OLEDs includes a cathode, the cathodes in a group of OLEDs being connected in parallel to a cathode bus, and the fuse being connected between the cathode and the cathode bus.

4. The light source claimed in claim 3, wherein the cathode and the cathode bus comprise a patterned layer of conductive material and the fuse comprises a neck of the conductive material between the cathode and the cathode bus.

5. The light source claimed in claim 4, wherein the cathode bus further comprises a metal conductor in electrical contact with the patterned layer of conductive material.

6. An organic light emitting diode (OLED) light source, comprising a plurality of groups of OLEDs, the OLEDs in each group being electrically connected in parallel, and the groups being electrically connected in series, wherein the groups of OLEDs comprise two subgroups connected in opposite directions, whereby the light source is responsive to an AC power source to emit light during both half cycles of the AC power.

7. The light source claimed in claim 6, wherein the subgroups are arranged in alternating rows of OLEDs connected in the opposite direction, whereby the light output of the light source is spatially uniform.

8. An organic light emitting diode (OLED) light source, comprising a plurality of groups of OLEDs, the OLEDs in each group being electrically connected in parallel, and the groups being electrically connected in series, further comprising a fuse connected in series with each OLED for opening the electrical connection to an OLED in response to a short, and further comprising means for periodically reverse biasing the OLEDs in a group to assist in blowing the fuse of any OLEDs that have failed short.

9. The light source claimed in claim 6, further comprising a fuse connected in series with each OLED for opening the electrical connection to an OLED in response to a short.

10. The light source claimed in claim 3, further comprising means for periodically reverse biasing the OLEDs in a group to assist in blowing the fuse of any OLEDs that have failed short.

11. The light source claimed in claim 4, further comprising means for periodically reverse biasing the OLEDs in a group to assist in blowing the fuse of any OLEDs that have failed short.

12. The light source claimed in claim 5, further comprising means for periodically reverse biasing the OLEDs in a group to assist in blowing the fuse of any OLEDs that have failed short.

13. The light source claimed in claim 6, wherein the OLEDs in a group are connected in alternating directions.

14. The light source claimed in claim 13, further comprising a fuse connected in series with each OLED for opening the electrical connection to an OLED in response to a short.

* * * * *